United States Patent
Ramachandra et al.

(10) Patent No.: US 12,261,528 B2
(45) Date of Patent: Mar. 25, 2025

(54) LOW VOLTAGE BUCK REGULATOR VOLTAGE REGULATION WITH REDUCED OVERSHOOT AND SETTLING TIME

(71) Applicant: Hamilton Sundstrand Corporation, Charlotte, NC (US)

(72) Inventors: Raghavendra Ramachandra, Karnataka (IN); Pradeep Chitirala, Bangalore (IN); Priya Kakarla Naga Lakshmi, Bangalore (IN); Mahtab Ahmed, Uttar Pradesh (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 274 days.

(21) Appl. No.: 17/900,224

(22) Filed: Aug. 31, 2022

(65) Prior Publication Data

US 2023/0387802 A1    Nov. 30, 2023

(30) Foreign Application Priority Data

May 30, 2022   (IN) .............................. 202211030945

(51) Int. Cl.
*H02M 3/158*  (2006.01)
*H02M 1/00*  (2006.01)
(Continued)

(52) U.S. Cl.
CPC ......... *H02M 3/158* (2013.01); *H02M 1/0038* (2021.05); *H02M 3/157* (2013.01); *H03K 3/033* (2013.01)

(58) Field of Classification Search
CPC .... H02M 1/0038; H02M 3/158; H02M 3/157; H03K 3/033
See application file for complete search history.

(56) References Cited

U.S. PATENT DOCUMENTS 6,229,292 B1   5/2001   Redl et al.
7,705,579 B1   4/2010   Hariman et al.
(Continued)

OTHER PUBLICATIONS

Cespedes, et al. "Constant-Power Load System Stabilization by Passive Damping", IEEE Transactions on Power Electronics, vol. 26, No. 7, Jul. 1, 2011, pp. 1832-1836.
(Continued)

*Primary Examiner* — Gustavo A Rosario-Benitez
*Assistant Examiner* — Kevin Ramon Albright
(74) *Attorney, Agent, or Firm* — CANTOR COLBURN LLP

(57) ABSTRACT

A power converter for providing power to a load includes a buck converter having a DC input and a DC output and that is configured to receive a DC voltage at the DC voltage input and provide DC output voltage at the DC output. The converter also includes a voltage monitor that monitors a voltage provided at the DC output and a selectively connectable transient suppression circuit connected across that DC output and connected to the voltage monitor. The selectively connectable transient suppression circuit includes a dissipation circuit and a suppression circuit switch connected in series with the dissipation circuit that controls charge dissipation from the DC output into the dissipation circuit based on the voltage monitor determining that the voltage across the DC output is above a threshold.

10 Claims, 6 Drawing Sheets

(51) Int. Cl.
*H02M 3/157* (2006.01)
*H03K 3/033* (2006.01)

(56) References Cited

U.S. PATENT DOCUMENTS

| | | | |
|---|---|---|---|
| RE43,946 E | 1/2013 | Sase et al. | |
| 10,116,288 B2 | 10/2018 | Rao et al. | |
| 11,095,221 B1 | 8/2021 | Hsu | |
| 2006/0012346 A1* | 1/2006 | Huang | H02M 1/15 |
| | | | 323/222 |
| 2007/0159445 A1* | 7/2007 | Nakagawa | H05B 41/384 |
| | | | 345/101 |
| 2011/0285427 A1* | 11/2011 | Koyama | H01L 24/73 |
| | | | 257/E29.198 |
| 2014/0139268 A1* | 5/2014 | Bayerer | H03K 17/063 |
| | | | 327/109 |
| 2015/0049525 A1* | 2/2015 | Mu | H02M 7/53871 |
| | | | 363/37 |
| 2015/0137884 A1* | 5/2015 | Kishnamurthi | H03G 1/0088 |
| | | | 330/9 |
| 2015/0357908 A1* | 12/2015 | Ekbote | H05B 45/3725 |
| | | | 363/126 |
| 2016/0262232 A1* | 9/2016 | Fukui | H05B 45/345 |
| 2018/0033374 A1* | 2/2018 | Jeong | G09G 3/2088 |
| 2018/0287489 A1* | 10/2018 | Ozanoglu | H02M 1/14 |
| 2019/0157975 A1* | 5/2019 | Vanin | H03K 7/08 |
| 2021/0242769 A1* | 8/2021 | Ishikura | H02M 3/1582 |
| 2022/0003564 A1* | 1/2022 | Oidemizu | G08G 1/005 |
| 2022/0193431 A1* | 6/2022 | Chapman | A61N 1/3993 |
| 2022/0385846 A1* | 12/2022 | Higuchi | H04N 25/77 |
| 2023/0361689 A1* | 11/2023 | Khamesra | H02M 3/1582 |
| 2023/0387796 A1* | 11/2023 | Wu | H02M 3/07 |
| 2024/0154453 A1* | 5/2024 | Hiratsuka | H02J 7/00309 |
| 2024/0239198 A1* | 7/2024 | Penney | B60L 58/20 |
| 2024/0239236 A1* | 7/2024 | Namuduri | B60L 58/18 |
| 2024/0240884 A1* | 7/2024 | Sankar | F28F 13/12 |

OTHER PUBLICATIONS

European Search Report for Application No. 23176224.6, mailed Oct. 31, 2023, 9 pages.

* cited by examiner

LOW VOLTAGE BUCK REGULATOR VOLTAGE REGULATION WITH REDUCED OVERSHOOT AND SETTLING TIME

CROSS-REFERENCE TO RELATED APPLICATIONS

This application claims the benefit of Indian Application No. 202211030945 filed May 30, 2022, the disclosure of which is incorporated herein by reference in its entirety.

BACKGROUND

Exemplary embodiments of the present disclosure pertain to the art of power converters and, in particular, to buck converters that having low overshoot and settling time.

Switched mode DC to DC converter power supplies are widely used to convert power from a source, such as mains power, to DC power supply for electronic devices.

Modern embedded control systems (e.g., a field programmable gate array—FPGA or other core such as DSP core) require voltage as low as 1V DC. In aerospace or in any domain a typical standard voltage available is 28V (or 48V). So for point of load (PoL) an efficient DC-DC converter is needed to step-down the 28V (or 48V) to 1V. Further, such devices can require accurate voltage (e.g, within 5%) always be provided.

One way to provide such power is through a buck converter. A buck converter is also referred to as step-down converter and is a DC-DC converter that reduces an input voltage to a lower, output voltage. A buck converter is in a class of converters called switched mode power supplies due the inclusion of a switching transistor that selectively provides a voltage from the input across and inductor. Such converters are small and lightweight but as further shown below, in certain situations modification of the standard circuit may be desired.

BRIEF DESCRIPTION

Disclosed is a power converter for providing power to a load. The power converter includes a buck converter having a DC input and a DC output and that is configured to receive a DC voltage at the DC voltage input and provide DC output voltage at the DC output and a voltage monitor that monitors a voltage provided at the DC output. The power converter also includes a selectively connectable transient suppression circuit connected across that DC output and connected to the voltage monitor. The selectively connectable transient suppression circuit includes a dissipation circuit and a suppression circuit switch connected in series with the dissipation circuit that controls charge dissipation from the DC output into the dissipation circuit based on the voltage monitor determining that the voltage across the DC output is above a threshold.

In addition to one or more of the features described above, or as an alternative to any of the foregoing embodiments, the selectively connectable transient suppression circuit is configured such that the suppression circuit switch is configured to electrically connect the dissipation circuit to the DC output when the voltage monitor determines that the voltage across the DC output is above the threshold.

In addition to one or more of the features described above, or as an alternative to any of the foregoing embodiments, the selectively connectable transient suppression circuit is configured such that suppression circuit switch is configured to electrically disconnect the dissipation circuit to the DC output when the voltage monitor determines that the voltage across the DC output is below the threshold and after a time period has elapsed.

In addition to one or more of the features described above, or as an alternative to any of the foregoing embodiments, the selectively connectable transient suppression circuit further includes: a trigger connected to the voltage monitor and the suppression circuit switch that controls operation of the suppression circuit switch.

In addition to one or more of the features described above, or as an alternative to any of the foregoing embodiments, the trigger is monoshot circuit that holds an input signal at its output for the time period.

In addition to one or more of the features described above, or as an alternative to any of the foregoing embodiments, the trigger is a monostable multi-vibrator and the time period is multiple of a switching frequency of the buck converter.

In addition to one or more of the features described above, or as an alternative to any of the foregoing embodiments, the dissipation circuit includes: a charge capacitor; a current limiting resistor connected in series with charge capacitor; and a dissipation resistor connected in parallel with the series connection of the charge capacitor and the current limiting resistor.

In addition to one or more of the features described above, or as an alternative to any of the foregoing embodiments, the buck converter includes: an inductor connected between the DC input and the DC output; a control switch connected between the DC input and inductor that control current flow to the inductor; and a controller that opens and closes the control switch with a signal based on the switching frequency.

In addition to one or more of the features described above, or as an alternative to any of the foregoing embodiments, the time period is 30 times a period of the signal.

In addition to one or more of the features described above, or as an alternative to any of the foregoing embodiments, the buck converter is included in an integrated circuit.

In addition to one or more of the features described above, or as an alternative to any of the foregoing embodiments, one or more of: the selectively connectable transient suppression circuit; the dissipation circuit; and the suppression circuit switch are included in the integrated circuit.

Also disclosed is a system that includes a power converter of any prior embodiment. The system also includes a load connected and a DC voltage source connected to the power converter. The power converter converts voltage received from DC voltage source from a first level to a second lower level and provides it to the load.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
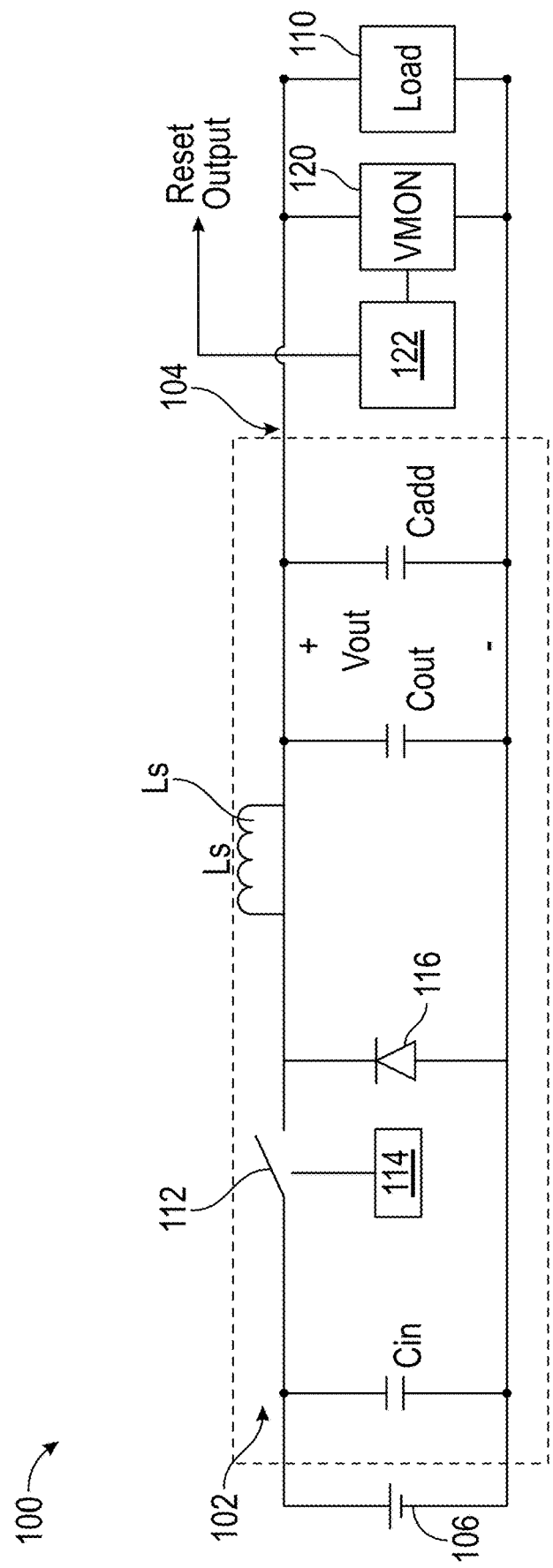
FIG. 1 shows an example of a buck converter connected to a load according to one embodiment.

FIG. 1 shows an example of a generic buck converter 100. This converter 100 will be used to show certain elements and to explain certain shortcomings thereof that embodiments disclosed herein may improve. The discussion of FIG. 1 may be aided by additional reference to FIGS. 2a-2c which show, respectively, load current during a reset of the load, current through the inductor Ls of the buck converter 100 and the output voltage of the buck converter 100.

The buck converter 100 includes DC input 102 and that receives an input voltage from a DC voltage source 106.

As illustrated, the buck converter 100 includes an input capacitor Cin across the DC input 102 that smooths the input voltage received from the DC voltage source 106. The converter 100 provides a stepped down DC voltage that is lower than the input voltage at its output 104. The voltage can be provided to a load 110 such as a digital signal processor (DSP) or a controller that, in one embodiment, can be an FPGA. The converter 100 can also be a single monolithic IC. Eg(LT8620)

The converter 100 also includes an output capacitor Cout across the output 104 to smooth the output. A switch 112 is connected between the DC input 102 and the inductor Ls. The inductor Ls is an energy storage element that is selectively switched into and out of electrical contract with the DC input 102 by the switch 112. It is understood that a controller 114 can be provided to control the switch 112 and based on the duty cycle of the switch, control how much the converter 100 steps down voltage at the output 104 (Vout) from the voltage received at the DC input 102 (e.g., the voltage provided by voltage source 106). As in known in the art, a control element 116 (such as a diode as illustrated or another transistor) can be provided that controls a direction current flow from the inductor Ls when Ls is disconnected from the source 106.

In certain instances, the load 110 can require accurate voltage be provided to it. To that end, a voltage monitor (VMON) 120 can be provided to monitor the output voltage Vout provide to the load. If the voltage is too high above or too far below a set threshold the monitor can indicate that an abnormal condition has occurred. Optionally, to help reduce the chances of fast, transitory changes causes too many alarms, an alarm or "glitch" filter 122 can be provided. This filter is shown as an independent element but can be part of the voltage monitor 120 in some cases. The alarm filter 122 may require that the "alarm condition" (e.g., VMON 120 provides a positive or alarm output indication) remain for a period of time before an alarm is recognized as an actual alarm as opposed to an anomaly or a momentary voltage fluctuation that resolves in a timely manner such that the load does not need to be reset.

The inventors hereof have discovered that is some instances, the converter 100 can experience extreme load transients conditions. These conditions can make it difficult for the converter 100 to maintain its output voltage (e.g, to avoid tripping the voltage monitor 120) under the following extreme load transient scenarios:
 a) Out of reset condition—load 110 draws large surge currents 10A or higher typically within 1 usec; and
 b) Going to reset condition—load suddenly stops drawing current.

To address "condition (a)" type load transient, the buck converter 100 can be modified to respond faster by using higher switching frequency (e.g., per controller 114) and using additional bulk capacitance at the output 104. The additional capacitance (Cadd in FIG. 1) is in addition to the output capacitance Cout and in connected across the output 104. Cadd is not typically present in prior art buck converters.

However, it has been discovered by the inventors hereof that the addition of the bulk capacitance Cadd may reduce performance under "condition (b)" type load transient.

With reference now to FIGS. 1 and 2a-2c, the larger output capacitance (Cadd) added to handle sudden demand in load under condition (a) type implies that large energy is stored in the output capacitor. Hence, under condition (b) type transient, when the load is suddenly removed (e.g., the load goes into reset), additional stored energy will take more time to discharge. This causes an initial overshoot and results in much larger settling time (greater than glitch time). This causes the voltage at buck converter output 104 to be above the over voltage trip threshold set by voltage monitor 120. As mentioned above, the voltage monitor 120 can be any type of circuit that can monitor over and under voltage rail voltages (e.g, Vout) and provide indication whether they are within the allowable voltage levels or not. However, due to the reduced settling time caused by Cadd, the monitor may generate nuisance trips/incorrect indication that buck converter is faulty which is not acceptable in safety critical applications.

Figure 2A:
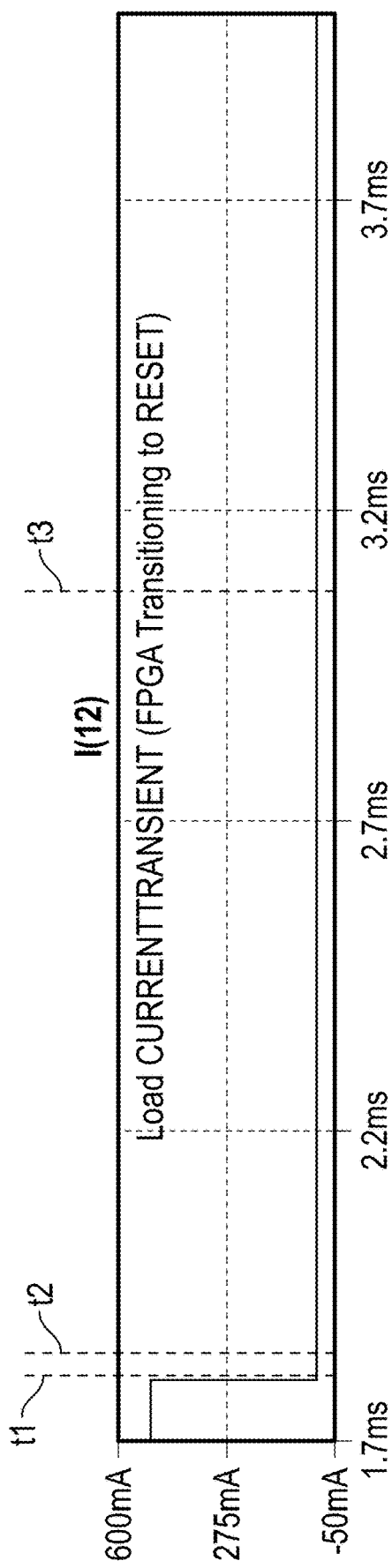
FIGS. 2a-2c show graphs of circuit values for the circuit of FIG. 1.
Figure 2B:
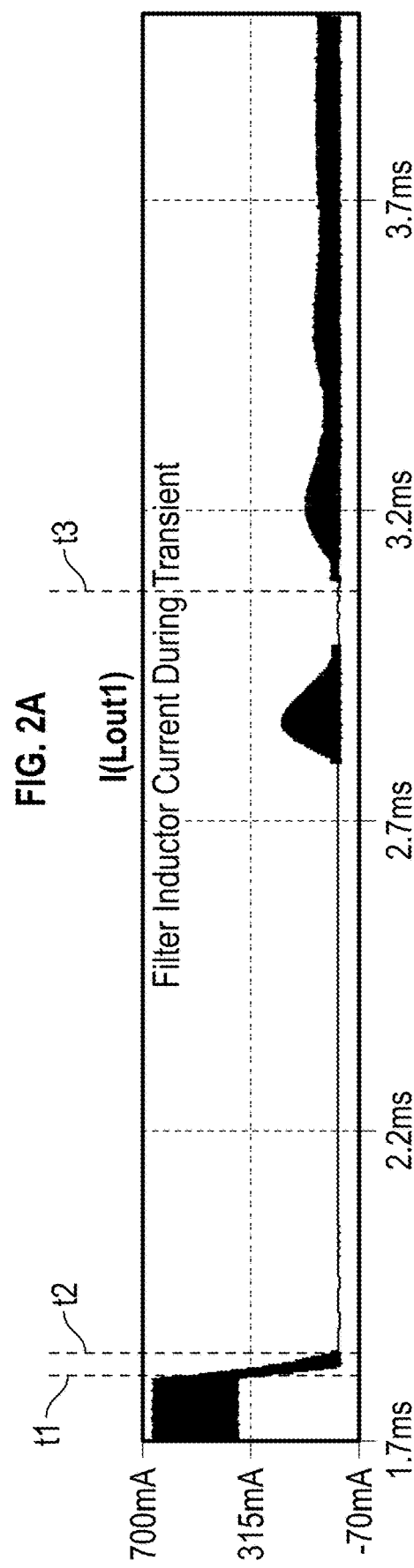
Figure 2C:
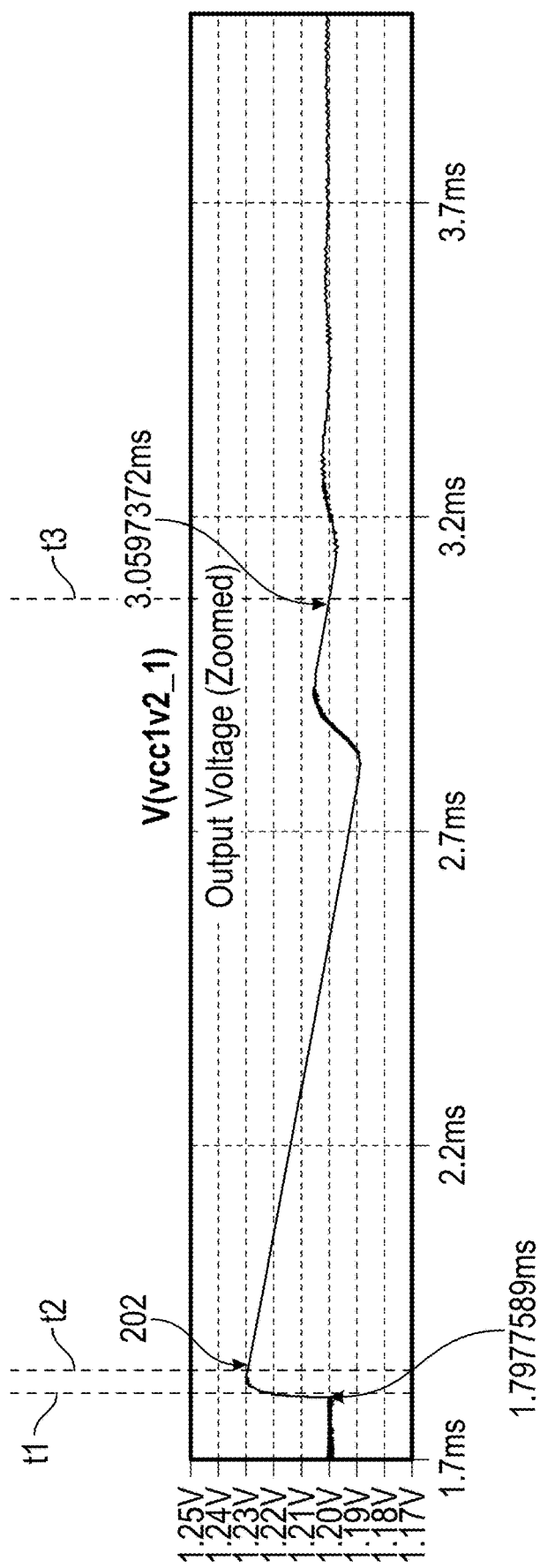

For example, consider FIGS. 2a-2c which show various currents/voltages over time, as the load 110 enters reset. In the reset condition, the current drawn by the load 110 drops from an normal operating value (in this case, about 500 mA) to a nominal/almost zero level at time t1. Also, at t1, the current through the inductor Ls sees a dramatic drop. This drop is not quit as fast as the current drop across the load and smooths out at a time t2. In this case, t241 can be about 0.1 ms but that is just an example. However, it is noted that in FIG. 2c the voltage across the output (Vout) has an initial rise (see peak 202) that decays as capacitors Cout and Cadd discharge through the load. In the example shown, Vout does not get back to stable output until t3 (about 1.3 ms after t2). This time, however, can result in faulty or nuisance trips as the time may be longer than that of the alarm filter 122.

To mitigate this problem, traditionally designers put some additional constant load on the output rail so that output capacitors (Cout/Cadd) can discharge faster reducing the settling time or utilize a linear regulator based design. Both these options result in increased power consumption.

Figure 3:
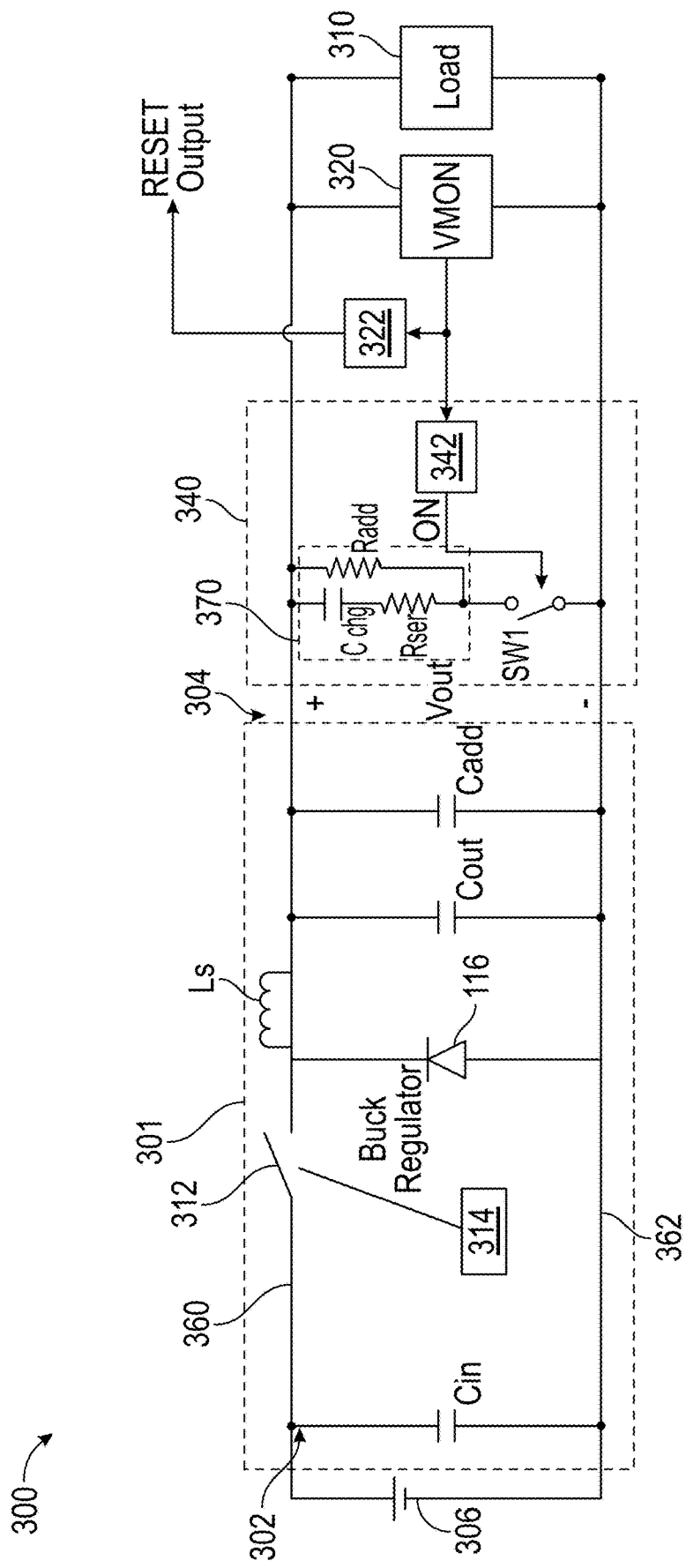
FIG. 3 shows an example of a buck converter connected to a load according to one embodiment.

To address the above noted issues related to condition b above, provided is system in the form of a circuit 300 that provides a constant output that is a stepped down version of a voltage provide at its input. The circuit 300 includes a buck converter 301 as shown in FIG. 3. The buck converter 301 includes the same elements as that of FIG. 1 and includes further elements. It should be noted that the buck converter 301 can be modified from the exact circuit shown in FIGS. 1/3 as long as it provides a constant stepped down output voltage. For example, the diodes 116/316 could be replaced by a transistor or other type of current flow control device. It shall be understood that the circuit 300 can be connected to a DC voltage source and load (and other elements) to form a system as shown in FIG. 3.

The circuit 300 may have reduced the settling time under "condition (b)" type load transient, so that incorrect fault indication is avoided in safety critical applications. This may allow for a simple buck regulator/converter to be used in safety critical applications where a fault has to be indicated quickly and correctly under "condition (b)" type transient conditions.

The circuit 300 includes a buck converter 301 and a selectively connectable transient suppression circuit 340.

The buck converter 301 can be as above or may be modified. While describe in greater detail below, the suppression circuit 340 is connected between the DC output 304 of the buck converter and the load 310. The suppression circuit 340 is an R/C circuit in one embodiment and is selectively connected into the circuit 300 (e.g., to the DC output 304 of the buck converter 301) by a control switch SW1 when a "condition (b)" type transient occurs. The suppression circuit 340 may reduce the overshoot and/or settling time across the output (Vout) and is connected for fixed duration. This duration can be selected based on the switching speed of the buck converter 301.

The circuit 300 includes a DC input 302 that is configured to receive an input voltage from a DC voltage source 306. Any DC voltage source discussed herein can be any source of a DC voltage such as, for example, a battery, a fly back converter, or DC rails to name but few.

The buck converter 301 shares this DC input 302 and, thus, is also configured to receive this a voltage across the DC input 302 and does so in operation. The buck converter 301 includes an input capacitor Cin across the DC input 302 that smooths the input voltage received from the DC voltage source 306. Herein, the circuit is shown as having a positive rail 360 and neutral rail 362 that are fed by the DC voltage source 306 and define the DC input 302. In operation, the converter 301 provides a stepped down DC voltage (Vout) at its DC output 304 that is lower than the voltage provided by DC voltage source 306.

The voltage can be provided to a load 310 such as a digital signal processor (DSP) or a controller that, in one embodiment, can be an FPGA. The converter 301 also includes an output capacitor Cout across the DC output 304 to smooth the output. The converter 301 can also be a single monolithic IC, eg LT8620. Other portions of the system of FIG. 3 can also be included in the same or a different IC including but not limited to, the selectively connectable transient suppression circuit, the dissipation circuit, and the suppression circuit switch are included in the integrated circuit all mentioned below.

An inductor Ls is connected between the DC input 302 and the DC output 304 as in a conventional buck converter. A control switch 312 is connected between the DC input 302 on the positive rail 360 and the inductor Ls. The inductor Ls is an energy storage element that is selectively switched into and out of electrical contact with the DC input 302 by the control switch 312. It is understood that a controller 314 can be provided to control the control switch 312 and based on the duty cycle of the switch, control how much the converter 301 steps down voltage at the DC output 304 (Vout) from the voltage received at the DC input 302 (e.g, the voltage provided by the DC voltage source 306). As in known in the art, a control element 116 (such as a diode as illustrated or another device such as transistor) can be connected between the rails 360 and 362, to control the direction of current flow from the inductor Ls when Ls is disconnected from the DC voltage source 306.

Similar to the above, a voltage monitor (VMON) 320 can be provided to monitor the output voltage Vout provided to the load 310. If the voltage is too high (e.g., above threshold) or too low the VMON 320 can indicate that an abnormal condition has occurred. That is, the VMON 320 can provide an output that is based on the DC output 304.

Optionally, to help reduce the chances of fast, transitory changes causes too many alarms, an alarm or glitch filter 322 can be provided. This filter is shown as an independent element but can be part of the voltage monitor 320 in some cases. The alarm filter 322 may require that the "alarm condition" (e.g., VMON 320 provides a positive or alarm output indication) remain for a period of time before an alarm is recognized as an actual alarm as opposed to an anomaly or a momentary voltage fluctuation that resolves in a timely manner such that the load does not need to be reset.

As in the above example, to address "condition (a)" type load transient discussed above, the buck converter 301 can includes additional bulk capacitance at the DC output 304. The additional capacitance (Cadd in FIG. 3) is in addition to the output capacitance Cout and in connected across the DC output 304.

To address the reduction long settling time introduced by Cadd, provided herein is the selectively connectable transient suppression circuit 340 (suppression circuit for short). The suppression circuit 340 can be electrically connected into the circuit 300 in the event of reset of the load 310 in one embodiment.

As shown, the suppression circuit 340 is connected in parallel with the DC output 304 and the load 310/VMON 320. As shown, the suppression circuit 340 is connected between the DC output 304 and the load 310. The exact location is, however, not so limited unless expressly stated in the claims below.

The selectively connectable transient suppression circuit 340 includes a trigger 342 that is connected to the output of the VMON 320. That is, it is connected, in one embodiment, to the same signal provided to the alarm filter 322. In operation, the trigger 342 will "hold" (on its output) the signal it receives at its input for specific amount to time. In this manner, the trigger 342 can be a mono-shot element/circuit. In one embodiment, the trigger 342 is a monostable multi-vibrator implemented either using IC based solution or discrete solution, which detects rising edge/falling edge based on the output of the VMON 320 and provides an ON output for a fixed duration.

The output of the trigger 342 is connected to a switch (SW1) and controls whether SW1 is conductive or non-conductive. In one embodiment, the fixed duration that the trigger 342 forces SW1 into the conductive (or ON) state is related to the switch frequency provided to the control switch 312 by the controller 314. In one embodiment, the duration is about 30 switching cycles (e.g., $30x$ the period of the signal provided to the control switch 312. While the switch SW1 is conductive, the suppression circuit 340 is electrically connected across the output DC 304 and when the switch SW1 non-conductive, the suppression circuit 340 in not electrically connected across the output DC 304 and is thereby effectively electrically removed from the circuit. Herein, the switch SW1 can also be called a suppression circuit control switch.

The suppression circuit 340 also includes a dissipation circuit 370. The dissipation circuit is an RC circuit that includes charge capacitor Cchg serially connected to a current limiting resistor Rser. Cchg and Rser are serially connected between the positive rail and suppression circuit control switch SW1 in FIG. 3 such that SW1 controls current flow through Cchg and Rser. When SW1 is closed charge balancing occurs between Cadd and Cchg resulting in overshoot limited to much smaller voltage that shown above and much faster settling time. Rser serves limit current through Cchg. The dissipation circuit 370 also includes a dissipation resistor Radd connected in parallel the serially connected Cchg and Rser to discharge the capacitor Cchg after SW1 is in the returned to the non-conductive state (e.g., after the trigger 342 expired).

In this manner, wherein selectively connectable transient suppression circuit 340 is configured such that the suppression circuit switch SW1 is configured to electrically connect the dissipation circuit 370 to the DC output 304 when the VMON 320 determines that the voltage across the DC output 304 is above a threshold (e.g., is out of range). Similarly, to disconnect, the suppression circuit switch SW1 can electrically disconnect the dissipation circuit 370 from the DC output 304 when the VMON 320 determines that the voltage across the DC output 304 is below the threshold and that the trigger 322 time has expired.

Figure 4A:
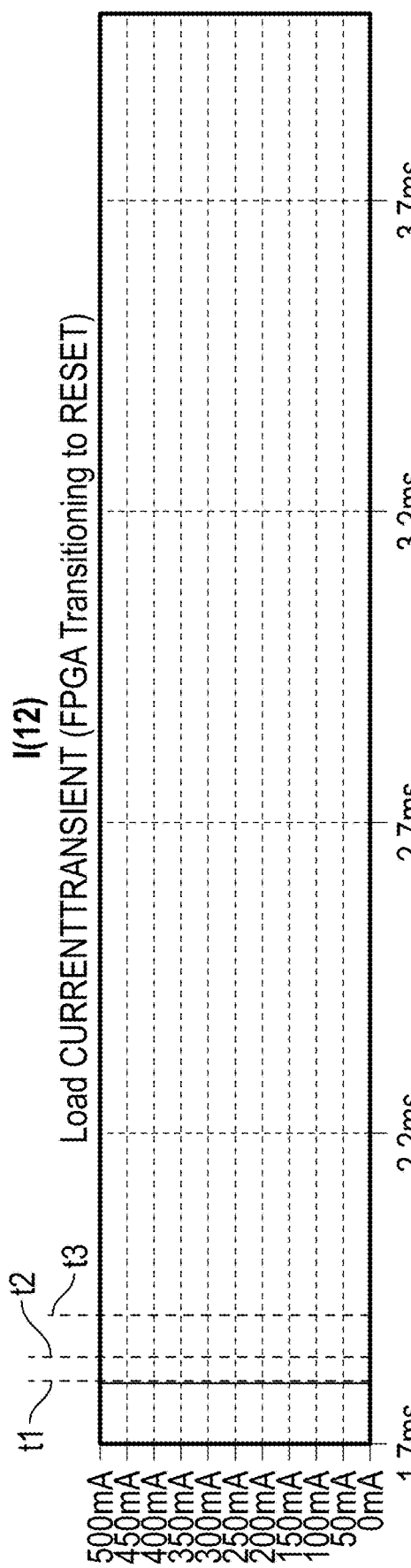
FIGS. 4a-4c show graphs of circuit values for the circuit of FIG. 3.
Figure 4B:
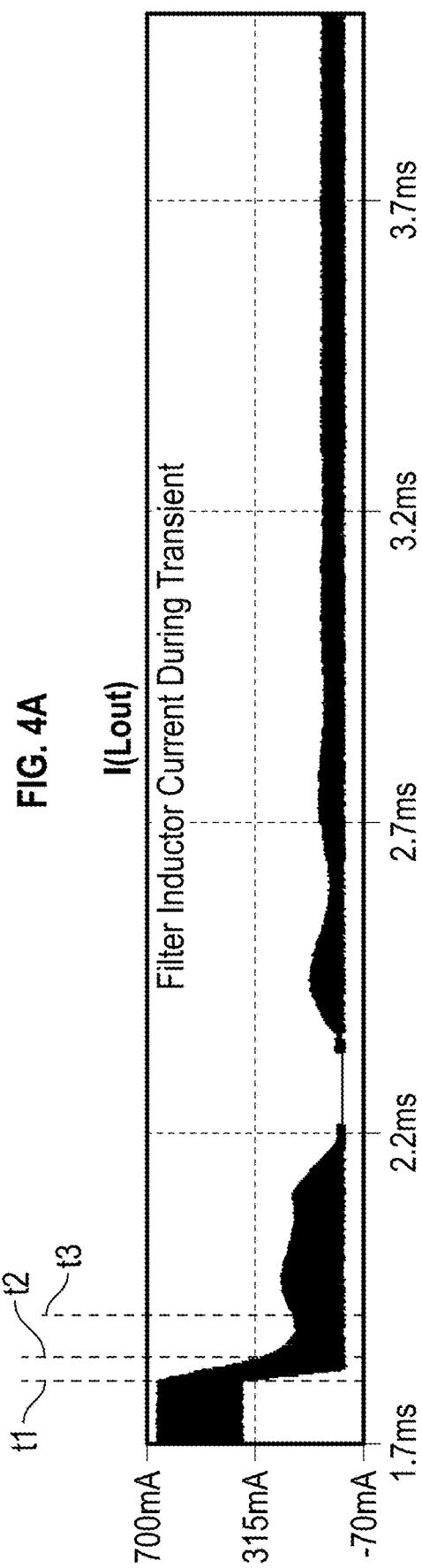
Figure 4C:
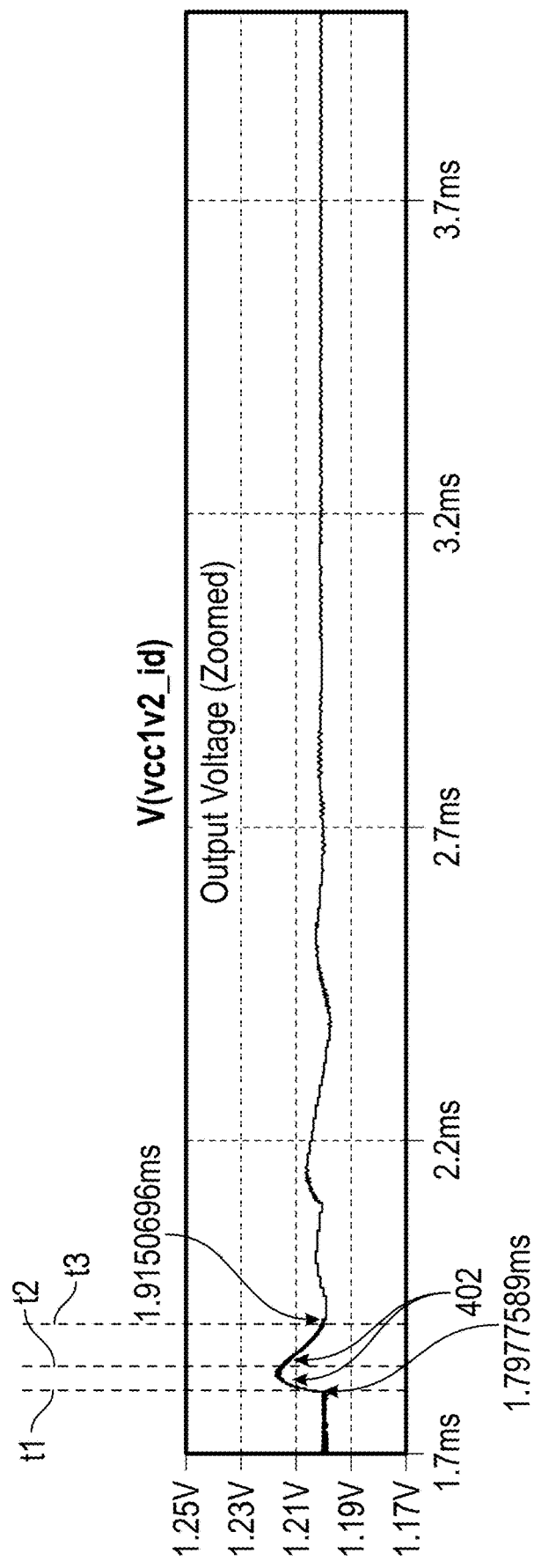

FIGS. 4a-4c shown a simulation of the circuit 300 during a condition (b)" event. FIGS. 4a-4c show various currents/voltages over time as the load 310 enters reset. In the reset condition, the current drawn by the load 310 (FIG. 4a) drops from a normal operating value (in this case, about 500 mA) to a nominal/almost zero level at time t1. Also, at t1, the current through the inductor Ls (FIG. 4b) sees a dramatic drop. FIG. 4c shows the voltage across the output (Vout) and has an initial rise (see peak 402) that decays as capacitors Cout and Cadd discharge through the load and into Cchg (e.g, charge balancing). In the example shown, Vouts get back to stable output at t3.

With further reference to FIGS. 3 and 4a-4c, as compared to buck converter 100 above, adding the additional capacitance Cchg allows for charge balancing between it and Cout/Cadd reducing in lower overshoot (e.g., peak 402 is lower than peak 202 of FIG. 2c). Further, this additional capacitance can reduce settling time bringing t3 much closer to t1 than in the prior circuit (e.g., less than 0.2 ms in the simulations of FIGS. 4a-4c).

Based on the above, the skilled artisan will realize that circuit 300 (e.g., a buck convert 301 in combination with the suppression circuit 340) can provide one or more of advantages. These can include in some embodiments one or more of: Very fast settling time (~8× improvement); Reduced overshoot (~2× improvement); No continuous power dissipation due to dummy load addition; Low power dissipation and high power density for a given regulator design and Simplicity of implementation due to easy scaling to different output voltage levels. to implement.

By way of example, in the simulation of FIGS. 4a-4c certain component values were used. These values are listed below but are not meant as limiting:
Cin=20 uF;
Ls=3.76 uH
Cout=14 uF;
Cadd=170 uF;
Cchg=10 uF;
Rser=5 ohms; and
Radd=120 ohms.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A power converter for providing power to a load, the power converter comprising:
   a buck converter having a DC input and a DC output and that is configured to receive a DC voltage at the DC voltage input and provide DC output voltage at the DC output;
   a voltage monitor that monitors a voltage provided at the DC output;
   a selectively connectable transient suppression circuit connected across that DC output and connected to the voltage monitor, the selectively connectable transient suppression circuit comprising:
   a dissipation circuit; and
   a suppression circuit switch connected in series with the dissipation circuit that controls charge dissipation from the DC output into the dissipation circuit based on the voltage monitor determining that the voltage across the DC output is above a threshold;
   wherein selectively connectable transient suppression circuit is configured such that the suppression circuit switch is configured to electrically connect the dissipation circuit to the DC output when the voltage monitor determines that the voltage across the DC output is above the threshold and to disconnect the dissipation circuit from the DC output when below the threshold and after a time period has elapsed;
   the selectively connectable transient suppression circuit further comprising:
   a monoshot circuit connected to the voltage monitor and the suppression circuit switch that controls operation of the suppression circuit switch and holds an input signal at its output for the time period, wherein the trigger is a monostable multi-vibrator and the time period is a multiple of a time period associated with the frequency of the buck converter.

2. The power converter to claim 1, wherein the dissipation circuit includes:
   a charge capacitor;
   a current limiting resistor connected in series with charge capacitor; and
   a dissipation resistor connected in parallel with the series connection of the charge capacitor and the current limiting resistor.

3. The power converter to claim 1, wherein the buck converter includes:
   an inductor connected between the DC input and the DC output;
   a control switch connected between the DC input and inductor that controls current flow to the inductor; and
   a controller that opens and closes the control switch with a signal based on the switching frequency.

4. The power converter of claim 3, wherein the time period is 30 times a period of the signal.

5. The power converter of claim 4, wherein the buck converter is included in an integrated circuit.

6. The power converter of claim 5, wherein one or more of: the selectively connectable transient suppression circuit; the dissipation circuit; and the suppression circuit switch are included in the integrated circuit.

7. A system comprising:
a load;
a DC voltage source; and
a power converter, the power converter connected to the load and the DC voltage and converting voltage received from DC voltage source from a first level to a second lower level and providing it to the load, the power converter comprising:
 a buck converter having a DC input connect to the DC voltage source and a DC output to the load;
 a voltage monitor that monitors a voltage provided at the DC output;
 a selectively connectable transient suppression circuit connected across that DC output and connected to the voltage monitor, the selectively connectable transient suppression circuit comprising:
  a dissipation circuit; and
  a suppression circuit switch connected in series with the dissipation circuit that controls charge dissipation from the DC output into the dissipation circuit based on the voltage monitor determining that the voltage across the DC output is above a threshold,
 wherein selectively connectable transient suppression circuit is configured such that the suppression circuit switch is configured to electrically connect the dissipation circuit to the DC output when the voltage monitor determines that the voltage across the DC output is above the threshold and to disconnect the dissipation circuit from the DC output when below the threshold and after a time period has elapsed;
 the selectively connectable transient suppression circuit further comprising:
  a monoshot circuit connected to the voltage monitor and the suppression circuit switch that controls operation of the suppression circuit switch and holds an input signal at its output for the time period, wherein the trigger is a monostable multivibrator and the time period is a multiple of a time period associated with the frequency of the buck converter.

8. The system of claim 7, wherein the dissipation circuit includes:
a charge capacitor;
a current limiting resistor connected in series with charge capacitor; and
a dissipation resistor connected in parallel with the series connection of the charge capacitor and the current limiting resistor.

9. The system of claim 7, wherein the buck converter includes:
an inductor connected between the DC input and the DC output;
a control switch connected between the DC input and inductor that controls current flow to the inductor; and
a controller that opens and closes the control switch with a signal based on the switching frequency.

10. The system of claim 7, wherein the buck converter is included in an integrated circuit and wherein one or more of the selectively connectable transient suppression circuit, the dissipation circuit, and the suppression circuit switch are included in the integrated circuit.

\* \* \* \* \*